United States Patent
Choi et al.

(10) Patent No.: US 9,147,557 B2
(45) Date of Patent: Sep. 29, 2015

(54) SPUTTER DEVICE

(75) Inventors: Yong-Sup Choi, Yongin (KR); Myung-Soo Huh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 622 days.

(21) Appl. No.: 13/446,873

(22) Filed: Apr. 13, 2012

(65) Prior Publication Data

US 2013/0026035 A1   Jan. 31, 2013

(30) Foreign Application Priority Data

Jul. 29, 2011  (KR) .................. 10-2011-0076042

(51) Int. Cl.
- *C23C 14/28* (2006.01)
- *H01J 37/32* (2006.01)
- *C23C 14/35* (2006.01)
- *H01J 37/34* (2006.01)

(52) U.S. Cl.
CPC ......... *H01J 37/32229* (2013.01); *C23C 14/352* (2013.01); *C23C 14/357* (2013.01); *H01J 37/32275* (2013.01); *H01J 37/3405* (2013.01)

(58) Field of Classification Search
CPC ..................... H01J 37/32229; H01J 37/32275
See application file for complete search history.

(56) References Cited

U.S. PATENT DOCUMENTS 5,133,826 A * 7/1992 Dandl ..................... 156/345.42
8,349,156 B2 * 1/2013 Stowell et al. .......... 204/298.38

FOREIGN PATENT DOCUMENTS

| JP | 2006-328437 A | 12/2006 |
| KR | 10-2005-0051195 A | 6/2005 |
| KR | 10-2010-0133056 A | 12/2010 |
| KR | 10-2011-0016347 A | 2/2011 |

* cited by examiner

*Primary Examiner* — Jason M Berman
(74) *Attorney, Agent, or Firm* — Christie, Parker & Hale, LLP

(57) ABSTRACT

A sputter device including a plurality of targets having magnetism; a reflector having magnetism and arranged between neighboring targets of the plurality of targets; a wave guide having magnetism and arranged adjacent the targets, the wave guide forming a guide space for guiding microwaves; and a limiter having magnetism and arranged adjacent the wave guide, the limiter forming an electron cyclotron resonance area together with the targets, the reflector, and the wave guide.

9 Claims, 3 Drawing Sheets

SPUTTER DEVICE

CROSS-REFERENCE TO RELATED APPLICATION

This application claims priority to and the benefit of Korean Patent Application No. 10-2011-0076042, filed on Jul. 29, 2011 in the Korean Intellectual Property Office, the entire content of which is incorporated herein by reference.

BACKGROUND

1. Field

Aspects of embodiments of the present invention relate to a sputter device.

2. Description of the Related Art

A sputter device represents a device for forming a deposition layer on a deposited object.

Recently, regarding a process for manufacturing an organic light emitting diode (OLED) display, in a thin film encapsulation layer for encapsulating an organic light emitting element by alternately stacking inorganic films and organic films on an organic light emitting element formed on a substrate, the inorganic films have been formed by using a sputter device.

However, a conventional sputter device cannot heat the substrate to a high temperature because of thermal vulnerability of the organic material included in the organic light emitting element and the organic film, and, therefore, quality of the inorganic film formed by the sputter device is deteriorated.

The above information disclosed in this Background section is only for enhancement of understanding of the background of the described technology and therefore it may contain information that does not form the prior art that is already known in this country to a person of ordinary skill in the art.

SUMMARY

According to an aspect of embodiments of the present invention, a sputter device improves quality of an inorganic film for forming a thin film encapsulation layer for encapsulating an organic light emitting element.

According to an embodiment of the present invention, a sputter device includes: a plurality of targets having magnetism; a reflector having magnetism and arranged between neighboring targets of the plurality of targets; a wave guide having magnetism and arranged on or adjacent the targets, the wave guide forming a guide space for guiding microwaves; and a limiter having magnetism and arranged on or adjacent the wave guide, the limiter forming an electron cyclotron resonance area together with the targets, the reflector, and the wave guide.

The targets may be self-rotatable.

A target of the plurality of targets may include: a target main body defining a space in the target and neighboring the electron cyclotron resonance area; and a first magnetic substance contacting the target main body and arranged in the space.

The reflector may include: a reflecting plate adjacent the electron cyclotron resonance area; and a second magnetic substance proximate the reflecting plate.

The wave guide may include: a guide main body having a closed loop form that is extended along a perimeter in the electron cyclotron resonance area and forming the guide space; a wave supplier connected to the guide main body and supplying the microwaves to the guide space; a window adjacent the electron cyclotron resonance area; a third magnetic substance between the guide main body and the window, extended along the guide main body, and arranged nearer the electron cyclotron resonance area than the guide main body; and a slot passing through the third magnetic substance between the guide space and the window.

The limiter may include a plurality of fourth magnetic substances that are separated from each other.

The electron cyclotron resonance area may have a pressure of about 1 µTorr to about 1 mTorr.

Plasma may be discharged in the electron cyclotron resonance area.

The sputter device may be configured to form an inorganic film for encapsulating an organic light emitting element formed on a substrate positioned on a side of the limiter opposite the electron cyclotron resonance area.

According to an aspect of embodiments of the present invention, a sputter device improves quality of an inorganic film for forming a thin film encapsulation layer for encapsulating an organic light emitting element.

DETAILED DESCRIPTION

Figure 1:
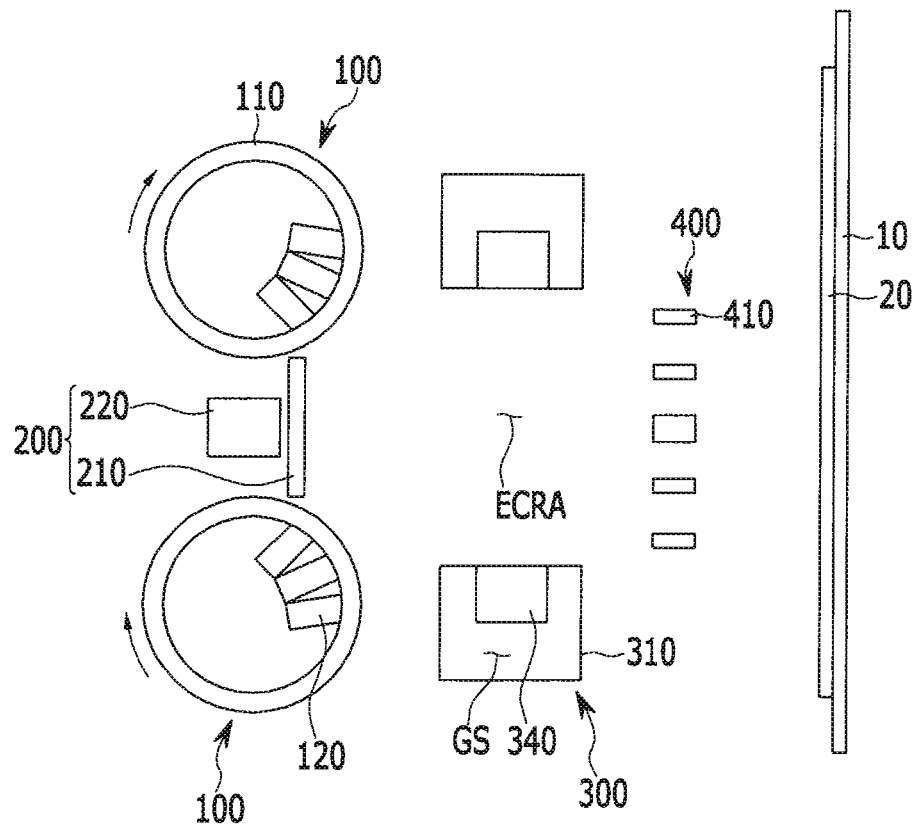
FIG. 1 is a schematic cross-sectional view of a sputter device according to an exemplary embodiment of the present invention.

Aspects of the present invention are described more fully hereinafter with reference to the accompanying drawings, in which some exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive, and like reference numerals designate like elements throughout the specification.

In addition, the size and thickness of each component shown in the drawings are arbitrarily shown for purposes of understanding and ease of description, but are not to be understood as limiting the present invention.

In addition, unless explicitly described to the contrary, the word "comprise" and variations such as "comprises" and "comprising" are to be understood to imply the inclusion of stated elements but not the exclusion of any other elements. Further, the term "on" is used herein to imply being positioned above or below a target element and does not imply being necessarily positioned on the top on the basis of a gravity direction.

A sputter device according to an exemplary embodiment of the present invention is described below with reference to FIG. 1 through FIG. 3.

FIG. 1 is a schematic cross-sectional view of a sputter device according to an exemplary embodiment of the present invention.

With reference to FIG. 1, the sputter device may be disposed in a chamber (not shown), and forms a deposition layer on a substrate 10 on which an organic light emitting element 20 is formed as a deposited object. The sputter device, in one embodiment, includes a plurality of targets 100 for forming, a reflector 200, a wave guide 300, and a limiter 400, which form an electron cyclotron resonance area (ECRA).

The plurality of targets 100 have magnetism. Each of the targets 100, in one embodiment, is self-rotatable and includes a target main body 110 and a plurality of first magnetic substances 120.

The target main body 110, in one embodiment, includes a material such as aluminum (Al) or tin (Sn) to be deposited on the substrate 10, and has a space (e.g., a circular space) formed in it. The target main body 110 is proximal to, or neighbors, the electron cyclotron resonance area (ECRA).

The first magnetic substance 120 is provided in the space formed inside the target main body 110, and contacts the target main body 110. The neighboring first magnetic substances 120 can have different magnetizing directions. The first magnetic substance 120 forms a magnetic field in the electron cyclotron resonance area (ECRA) direction. The first magnetic substance 120 may be an electromagnet or a permanent magnet.

The reflector 200 is provided between the neighboring targets 100 from among the plurality of targets 100. The reflector 200 is provided between the neighboring targets 100 to face the limiter 400. The reflector 200, in one embodiment, has magnetism and includes a reflecting plate 210 and a second magnetic substance 220.

The reflecting plate 210, in one embodiment, is proximal to, or neighbors, the electron cyclotron resonance area (ECRA) and includes at least one metal, such as at least one of molybdenum (Mo), gold (Au), silver (Ag), platinum (Pt), tantalum (Ta), and stainless steel. A plate surface of the reflecting plate 210 faces the limiter 400.

The second magnetic substance 220 is provided near the reflecting plate 210, and forms a magnetic field in the electron cyclotron resonance area (ECRA) direction. The second magnetic substance 220 may be an electromagnet or a permanent magnet.

The wave guide 300 is provided on or adjacent the reflector 200 and the targets 100.

Figure 2:
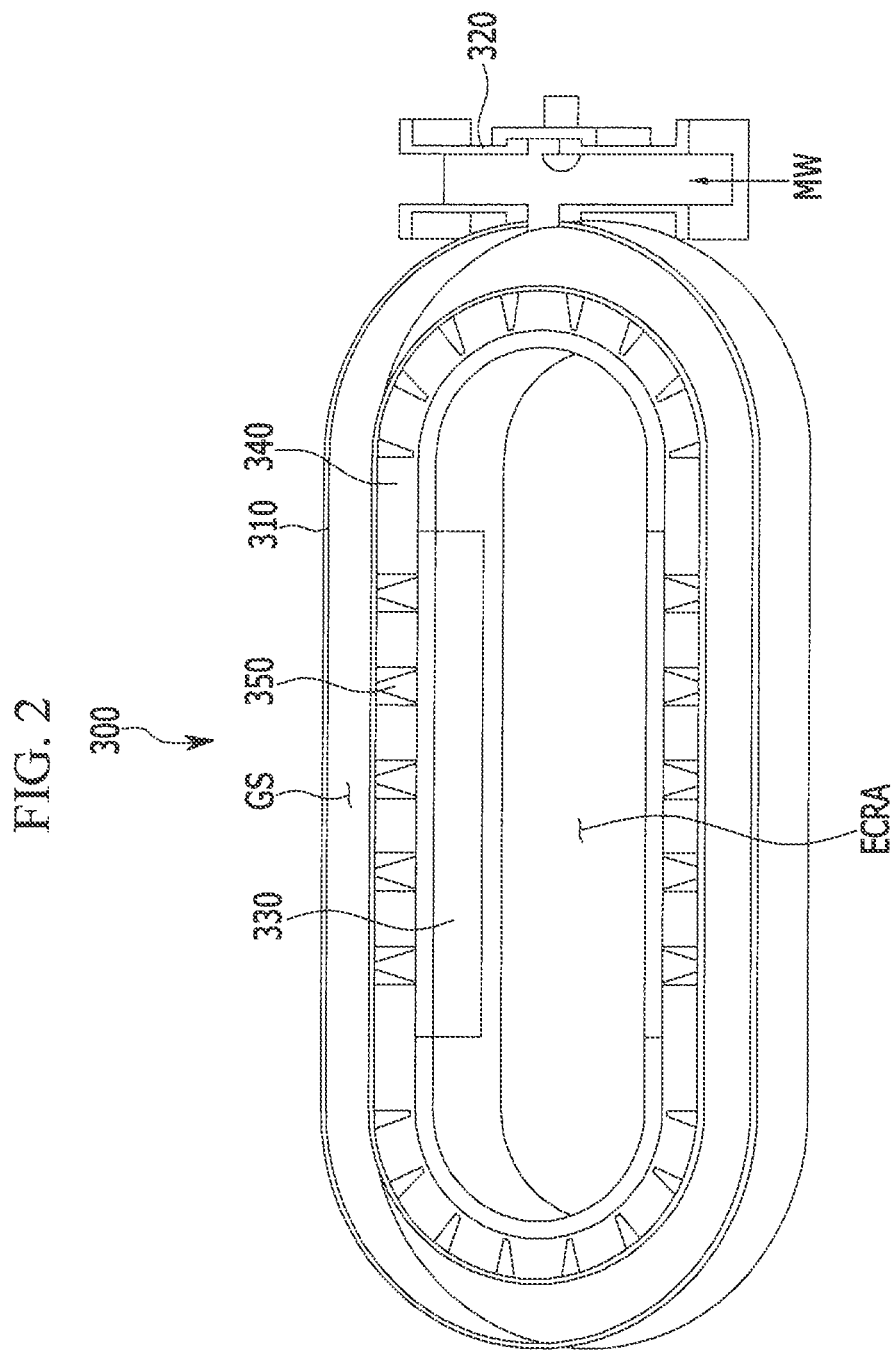
FIG. 2 is a schematic perspective view of a wave guide of the sputter device of FIG. 1.

FIG. 2 is a schematic perspective view of the wave guide 300 shown in FIG. 1.

As shown in FIG. 2, the wave guide 300 guides microwaves (MW), and has magnetism. The wave guide 300, in one embodiment, includes a guide main body 310, a wave supplier 320, a window 330, a third magnetic substance 340, and a slot 350.

The guide main body 310 has a closed loop shape that is extended to surround the electron cyclotron resonance area (ECRA) along the perimeter of the electron cyclotron resonance area (ECRA). The guide main body 310 forms a guide space (GS) for guiding the microwaves. The microwaves supplied by the wave supplier 320 through the guide space (GS) of the guide main body 310 move along the perimeter of the electron cyclotron resonance area (ECRA).

The wave supplier 320, in one embodiment, is connected to a portion of the guide main body 310 and supplies the microwaves (MW) to the guide space (GS).

The window 330 neighbors the guide main body 310 and is provided nearer the electron cyclotron resonance area (ECRA) than the guide main body 310. That is, the window 330 neighbors the electron cyclotron resonance area (ECRA), and the microwaves (MW) that move in the guide space (GS) of the guide main body 310 through the window 330 are input to the electron cyclotron resonance area (ECRA).

The third magnetic substance 340, in one embodiment, is provided between the guide main body 310 and the window 330, and is extended in a closed loop form along the guide main body 310. The third magnetic substance 340 is provided nearer the electron cyclotron resonance area (ECRA) than the guide main body 310.

The slot 350 passes through the third magnetic substance 340 and connects the guide space (GS) and the window 330. The microwaves moving in the guide space (GS) can move to the window 330 through the slot 350, and the microwaves having moved to the window 330 are input to the electron cyclotron resonance area (ECRA) through the window 330.

The limiter 400 having magnetism is provided on or adjacent the wave guide 300 to neighbor the electron cyclotron resonance area (ECRA). The limiter 400 includes a plurality of fourth magnetic substances 410 that are positioned with a gap therebetween. In one embodiment, the limiter 400 forms the electron cyclotron resonance area (ECRA) together with the target 100, the reflector 200, and the wave guide 300. The electron cyclotron resonance area (ECRA), in one embodiment, has a pressure of about 1 µTorr to about 1 mTorr.

Figure 3:
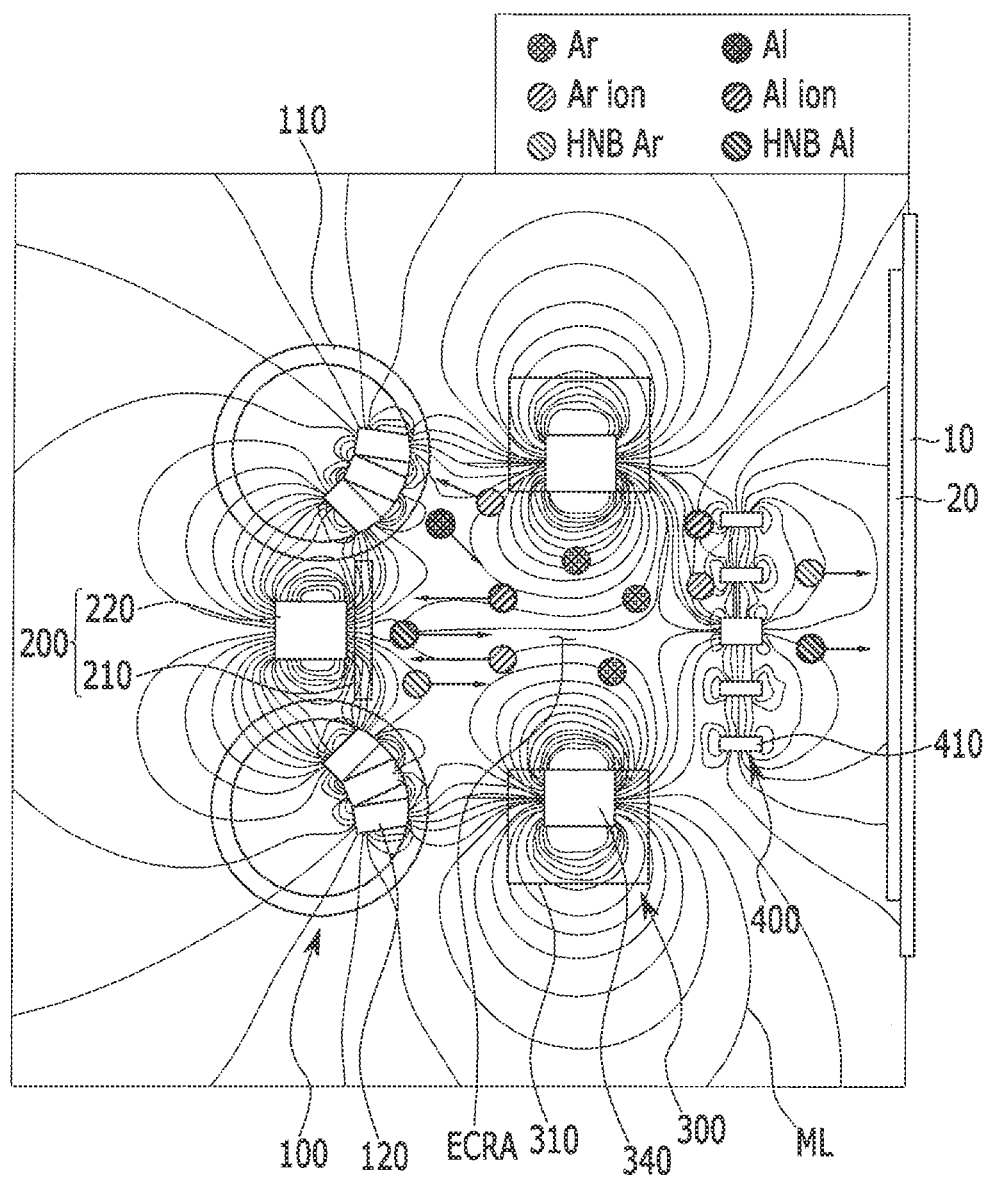
FIG. 3 is a schematic cross-sectional view showing formation of a deposition layer by a sputter device according to an exemplary embodiment of the present invention.

As described, in the sputter device according to an embodiment of the present invention, the target 100, the reflector 200, the wave guide 300, and the limiter 400 respectively have magnetism and form the electron cyclotron resonance area (ECRA) such that the magnetic field is formed along a perimeter (e.g., the entire perimeter) of the electron cyclotron resonance area (ECRA), and the microwaves input to the electron cyclotron resonance area (ECRA) through the magnetic field and the window 330 are resonated while the electrons are captured and rotated, and a high-density plasma is formed in the electron cyclotron resonance area (ECRA), and a high-density deposition layer may be formed by the high-density plasma on the substrate 10 on which the organic light emitting element 20 is formed, which is described in further detail below with reference to FIG. 3

Formation of a deposition layer by a sputter device according to an exemplary embodiment of the present invention is described below with reference to FIG. 3.

FIG. 3 shows formation of a deposition layer by a sputter device according to an exemplary embodiment of the present invention.

As shown in FIG. 3, high-density plasma is formed in the electron cyclotron resonance area (ECRA) by magnetic field lines (ML) that surround the electron cyclotron resonance area (ECRA), and while the high-density plasma does not move toward the substrate 10 because of the limiter 400, high-energy neutral particle beams reflected by the reflector 200 reach the substrate 10 to form a high-density deposition layer on the substrate 10 on which the organic light emitting element 20 is formed.

As an example, as illustrated in FIG. 3, a case of depositing an inorganic film including alumina ($Al_2O_3$) for the deposition layer on the substrate 10 will now be described. To form an inorganic film including alumina, when a high-density plasma is formed by resonance in the electron cyclotron resonance area (ECRA) while an oxygen atmosphere is formed on the side of the substrate 10, the targets 100 include aluminum (Al), and argon particles (Ar) are provided in the electron cyclotron resonance area (ECRA). The argon particles (Ar) are transformed into argon ions (Ar ion), and the argon ions (Ar ion) collide with the target 100. Therefore, aluminum particles (Al) are output into the electron cyclotron resonance area (ECRA) from the target 100, and the output aluminum particles (Al) are transformed into aluminum ions (Al ion). The aluminum ions (Al ion) and the argon ions (Ar ion) provided in the electron cyclotron resonance area (ECRA) are reflected by the reflector 200 to be transformed into high-energy aluminum neutral particle beams (HNB Al) and argon neutral particle beams (HNB Ar), respectively, and are moved to the substrate 10 by passing through the limiter 400. The high-energy aluminum neutral particle beams (HNB Al) and the argon neutral particle beams (HNB Ar) having moved to the substrate 10 form an inorganic film including high-density alumina on the substrate 10. The plasma including the aluminum ions (Al ion) and the argon ions (Ar ion) do not move to the substrate 10 because of the limiter 400.

As described, the sputter device forms a high-density plasma in the electron cyclotron resonance area (ECRA) by resonance between the magnetic field and the microwaves, and high-energy neutral particle beams formed by reflecting the high-density plasma on the reflector 200 move to the substrate 10 to form a high-density deposition layer on the substrate 10. That is, the high-density plasma is formed in the electron cyclotron resonance area (ECRA) and the deposition layer is formed on the substrate 10 by using high-energy neutral particle beams, such that the high-density deposition layer may be formed on the substrate 10 without additionally heating the substrate 10.

That is, the sputter device can deposit an inorganic film that encapsulates the organic light emitting element 20 on the substrate 10 by using the high-energy neutral particle beams, while the substrate 10 and the organic materials, which have thermal weakness, included in the organic light emitting element 20 and the organic film, are not heated to a high temperature.

Also, the sputter device forms the electron cyclotron resonance area (ECRA) while the targets 100, the reflector 200, the wave guide 300, and the limiter 400 each have magnetism, such that the magnetic field lines (ML) are formed to surround the electron cyclotron resonance area (ECRA), such as around the entire electron cyclotron resonance area (ECRA), and the magnetic field surrounds the electron cyclotron resonance area (ECRA). The plasma formed in the electron cyclotron resonance area (ECRA) by the resonance between the magnetic field and the microwaves is thereby formed to have high density. That is, in one embodiment, since the sputter device forms the magnetic field not on a part of the electron cyclotron resonance area (ECRA) but on the entire region of the electron cyclotron resonance area (ECRA), the high-density plasma is formed in the electron cyclotron resonance area (ECRA) by resonance, and since the high-density plasma is reflected by the reflector 200 to form high-energy neutral particle beams, the flux of the neutral particle beams moving toward the substrate 10 is improved to increase the density of the deposition layer deposited on the substrate 10 by the neutral particle beams without heating the substrate 10.

Further, the sputter device, in one embodiment, forms the pressure of the electron cyclotron resonance area (ECRA) to be from about 1 µTorr to about 1 mTorr to improve the mean free path of the neutral particle beams moving in the electron cyclotron resonance area (ECRA) as compared to a conventional sputter device using a pressure that is greater than 1 mTorr, such that deterioration of the energy of the neutral particle beams caused by collision among the neutral particle beams is minimized or reduced. Therefore, the flux of the neutral particle beams moving toward the substrate 10 is improved to increase the density of the deposition layer that is deposited on the substrate 10.

In one embodiment, the sputter device does not include a separate magnetic substance for forming the electron cyclotron resonance area (ECRA), and the target 100, the reflector 200, the wave guide 300, and the limiter 400 for forming the deposition layer by using the neutral particle beams respectively have magnetism such that a separate magnetic substance is not needed, which reduces production and maintenance costs of the sputter device.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A sputter device comprising:
  a plurality of targets having magnetism;
  a reflector having magnetism and arranged between neighboring targets of the plurality of targets;
  a wave guide having magnetism and arranged adjacent the targets, the wave guide forming a guide space for guiding microwaves; and
  a limiter having magnetism and arranged adjacent the wave guide, the limiter farming an electron cyclotron resonance area together with the targets, the reflector, and the wave guide,
  wherein the reflector comprises a reflecting plate between the neighboring targets and adjacent the electron cyclotron resonance area and facing the limiter, and
  wherein the plurality of targets and the reflector are arranged at a first side of the wave guide, and the limiter is arranged at a second side of the wave guide opposite the first side.

2. The sputter device of claim 1, wherein the targets are self-rotatable.

3. The sputter device of claim 2, wherein a target of the plurality of targets comprises:
  a target main body defining a space in the target and neighboring the electron cyclotron resonance area; and
  a first magnetic substance contacting the target main body and arranged in the space.

4. The sputter device of claim 1, wherein the reflector further comprises:
  a second magnetic substance proximate the reflecting plate.

5. The sputter device of claim 1, wherein the wave guide comprises:
  a guide main body having a closed loop form that is extended along a perimeter in the electron cyclotron resonance area and forming the guide space;
  a wave supplier connected to the guide main body and supplying the microwaves to the guide space;
  a window adjacent the electron cyclotron resonance area;
  a third magnetic substance between the guide main body and the window, extended along the guide main body, and arranged nearer the electron cyclotron resonance area than the guide main body; and
  a slot passing through the third magnetic substance between the guide space and the window.

6. The sputter device of claim 1, wherein the limiter comprises a plurality of fourth magnetic substances that are separated from each other.

7. The sputter device of claim 1, wherein the electron cyclotron resonance area has a pressure of about 1 µTorr to about 1 mTorr.

8. The sputter device of claim 1, wherein plasma is discharged in the electron cyclotron resonance area.

9. The sputter device of claim 1, wherein the sputter device is configured to form an inorganic film for encapsulating an organic light emitting element formed on a substrate positioned on a side of the limiter opposite the electron cyclotron resonance area.

* * * * *